United States Patent [19]
Beale et al.

[11] 3,952,325
[45] Apr. 20, 1976

[54] SEMICONDUCTOR MEMORY ELEMENTS

[75] Inventors: Julian Robert Anthony Beale; Peter James Daniel, both of Salfords near Redhill, England

[73] Assignee: U.S. Philips Corporation, New York, N.Y.

[22] Filed: July 26, 1972

[21] Appl. No.: 275,321

[30] Foreign Application Priority Data
July 28, 1971 United Kingdom............... 35400/71

[52] U.S. Cl.................................. 357/23; 357/24; 357/59; 307/304; 340/173 R
[51] Int. Cl.².......................................... H01L 29/78
[58] Field of Search...... 317/235 B, 235 G, 235 AT; 340/173; 307/304

[56] References Cited
UNITED STATES PATENTS
| | | | |
|---|---|---|---|
| 3,462,657 | 8/1969 | Brown............................... | 317/235 |
| 3,728,695 | 4/1973 | Frohman-Bentchkowsky.... | 317/235 |

OTHER PUBLICATIONS
*Applied Physics Letters*, "Avalanche Injection Currents & Charging Phenomena in Thermal $SiO_2$" by Nicollian et al., pp. 174–177, Sept. 1969.

*IBM Tech. Discl. Bul.*, "Floating Avalanche–Injection Metal–Oxide Semiconductor Device With Low–Write Voltage" by Terman, p. 3721 May 1972.

*Primary Examiner*—Andrew J. James
*Attorney, Agent, or Firm*—Frank R. Trifari; Leon Nigohosian

[57] ABSTRACT

A semiconductor memory element comprising a semiconductor substrate and an insulating layer thereon, a charge storage element located on a portion of the insulating layer and separated from the semiconductor substrate, and first device means for injecting hot electrons from the semiconductor substrate into the insulating layer portion to write a first charge state on the charge storage element and second device means for injecting hot holes from the semiconductor substrate into the insulating layer portion to write a second charge state on the charge storage element.

10 Claims, 6 Drawing Figures

SEMICONDUCTOR MEMORY ELEMENTS

The invention relates to a semiconductor memory element comprising an insulating layer portion adjacent a surface of a semiconductor body or substrate, and a charge storage element in the form of a conductive layer on the insulating layer portion and separated thereby from the semiconductor substrate, the charge state on the conductive layer determining different memory states which are readable in operation of the memory element.

The use of an insulated, floating conductive layer as a semi-permanent charge storage element was proposed by D. Kahng and S. M. Sze in Bell System Technical Journal, July-August 1967, pages 1289 to 1295. The proposed arrangement comprises a semiconductor-insulator-metal-insulator-metal sandwich structure: the outer metal forms a biassing gate separated from a floating, metal gate by an insulator across which electron transport is small; the floating metal gate is separated from a p-type semiconductor body or substrate by an insulating layer portion thin enough to permit a field-controlled electron transport mechanism such as tunnelling or internal tunnel-hopping. When an appropriately high electric field is applied through the outer metal biasing gate, the floating metal gate charges by electron tunnelling from the semiconductor body or substrate. The charges are stored on the floating metal gate even after the removal of the charging field, due to the much lower back transport probability. Thus, the resulting memory element is non-volatile, namely it retains the stored information without an external power source. Read-out of the memory element can be provided by using the floating metal gate as an insulated gate of a field effect transistor structure present in the semiconductor body or substrate. One disadvantage of this memory element is that the insulating layer required between the semiconductor body or substrate and the floating gate must be very thin, for example, approximately 50 A, for electron tunnelling.

According to the invention, a semiconductor memory element of the type mentioned in the preamble, is characterized in that a first semiconductor device structure is present in the semiconductor body or substrate adjacent one part of the insulating layer and providing means for injecting hot electrons from the semiconductor body or substrate into the insulating layer portion to write a first charge state on the conductive layer, and a second semiconductor device structure present in the semiconductor body or substrate adjacent another part of the insulating layer portion and providing means for injecting hot holes from the semiconductor body or substrate into the insulating layer portion to write a second charge state on the conductive layer.

In this manner, a read-write memory is formed, in which a particular memory state can be erased or changed by injection of either hot electrons from the first semiconductor device structure or hot holes from the second semiconductor device structure. The term "hot" charge carriers is well known in the semiconductor art as a designation of charge carriers which have an average energy considerably in excess of that appertaining to the lattice temperature, for example a carrier temperature several times the lattice temperature.

When there is no other current path to or from the conductive layer, the memory element is non-volatile.

One of the said first and second semiconductor device structures may comprise an avalanche diode arrangement. Such a diode arrangement undergoes avalanche breakdown under high reverse biasing so producing pairs of hot charge carriers, only one type of which is injected into the insulating layer portion. Such injection may be termed "avalanche injection". When, for example, the semiconductor substrate is of silicon and the one part of the insulating layer portion is of thermally grown silicon oxide, the injection barrier for holes is greater than that for electrons; thus, when hot carrier pairs are produced under avalanche breakdown in the first semiconductor device structure, the hot electrons are injected from the silicon substrate into the thermally grown silicon oxide layer part in preference to the hot holes and this results in the transfer of negative charge to the conductive layer. To minimise trapping of the injected electrons, it appears that the oxide should be grown in dry oxygen.

However, avalanche injection can be disadvantageous in certain cases; both the magnitude of the charge carrier current produced for injection and the degree of heating of these charge carriers are determined by the reverse bias producing the avalanche conditions, and this can restrict the injection efficiency of the heated carriers. Furthermore, the hot charge carriers are produced in pairs, and when the substrate-insulating layer arrangement is such that one carrier type (for example electrons) is injected in preference to the other, it can be very difficult, even impossible in certain cases, to inject the other type of carrier by avalanche injection from the other of the first and second semiconductor device structures. Therefore, in a preferred form, at least one of the said first and second semiconductor device structures injects charge carriers into the insulating layer portion other than by avalanche injection.

In a preferred form, at least one of the said first and second semiconductor device structures is a transistor structure which comprises part of the body or substrate and electrode connections thereto, and provides one arrangement for producing a current of charge carriers of one type in the semiconductor substrate and another arrangement for producing in the semiconductor substrate adjacent the insulating layer portion such a high electric field for increasing the energy of charge carriers produced by the one arrangement that hot charge carriers of this one type are obtainable which are injected into the insulating layer portion from the semiconductor substrate. With such a transistor structure the magnitude of the charge carrier current of the one conductivity type can be chosen substantially independently of the degree of heating of the charge carriers, so that more efficient injection of these charge carriers can result. Furthermore, the charge carriers of the one type are produced and heated by this device structure without the same structure similarly producing and heating charge carriers of the other type such as occurs with the electron-hole production in avalanche breakdown. Thus, for example, such a transistor structure can provide hot hole injection to transfer positive charge to the conductive layer. The said high electric field which provides heating of the carriers may be produced substantially normal or even substantially parallel to the said surface. The collector or drain of the transistor can extract charge carriers not permanently injected into the insulating layer portion.

The transistor structure may be an inverted bipolar transistor which comprises a collector adjacent the said surface and separated by a base region of the one conductivity type from a surface-remote emitter region of the opposite conductivity type, and electrodes may contact the collector, and the base and emitter regions. Such a transistor provides means for injecting hot carriers of the one conductivity type. The high electric field produced in operation at the reverse-biased collector-base junction is substantially normal to the said surface and accelerates the charge carriers towards the said surface. In one form of this transistor, the said collector is a thin metal electrode layer which forms a rectifying Schottky junction with the base region. In another form, the said collector consists of a semiconductive region of the said opposite conductivity type adjoining the said surface, and thicker collector contact regions of the said opposite conductivity type mutually spaced across the collector layer region, which collector contact regions provide means for extracting charge carriers not permanently injected in the insulating layer portion; thus, the carriers not permanently injected do not form a space charge neutralising the original high electrode field. The said collector layer region may have a thickness of at most 200 A, for example, and a type determining impurity concentration of at least $5 \times 10^{18}$ atoms/c.c., and may be an implanted region. Mutually spaced high conductivity portions of the base region may be present adjacent the emitter-base junction below the mutually spaced collector contact regions, which high conductivity portions reduce the injection from the emitter region of minority charge carriers into three portions of the base region below the collector contact regions. A narrow high conductivity portion of the base region may be present adjacent the collector layer region and spaced from the emitter-base junction, which narrow high conductivity portion serves to concentrate near the surface the electric field produced at the collector-base junction under reverse bias. Very efficient injection of hot charge carriers of the one conductivity type can be achieved using an inverted bipolar transistor. Thus, for example, it is possible to accelerate the charge carriers through approximately 2 volts within approximately 300 to 400 A of the said surface. This distance is still much larger than the mean free path for hot holes in silicon (namely approximately 100 A), but the maximum energy that a hole can lose in a collision is the optical phonon energy (63 meV), providing the voltage is below the threshold for ionising collisions. Thus, such a heated hole can undergo many collisions and still have enough energy to cross the barrier into the wide band gap material. Those carriers that fail to cross, or fail to stay in the wide band gap material are drained away by the mutually spaced collector contact regions.

The transistor structure which constitutes one of the first and second semiconductor device structures may comprise, adjacent the said surface, source, drain and channel of a field effect transistor, which channel is a shallow surface layer of the opposite conductivity type in a substrate portion of one conductivity type. Such a field effect transistor provides means for injecting hot carriers of the said opposite conductivity type. The high electric field produced in operation between the source and drain is substantially parallel to the said surface, as is the carrier drift in this device. Thus, the temperature of the charge carriers of the opposite conductivity type flowing in the direction of the high electric field can be raised to several times the lattice temperature. The high electric field may be of the order of $10^4$ or $10^5$ volts/cm.

In one form of such a field effect transistor, the source and drain are metal electrodes which form rectifying Schottky junctions with the substrate portion of the one conductivity type. In another form, the said source and drain comprise source and drain electrodes contacting source and drain regions of the said opposite conductivity type present in the substrate portion of the one conductivity type. The shallow surface layer forming the channel may in certain cases be an inversion layer induced at the surface of the substrate portion by charges at or near this surface. However, the said shallow surface layer may be an impurity-doped semiconductor region, preferably, for example, formed by implanted impurity of the said opposite conductivity type. The implantation may be effected by conventional implantation of ions of impurity atoms of the said opposite conductivity type at the surface of the substrate portion. In another form, the implantation is effected by ion bombardment of a layer of impurity atoms of the said opposite conductivity type at the said surface, which bombardment is such as to knock, by energy transfer, impurity atoms from the layer into the surface of the substrate portion to form the shallow surface layer. Part of the drain may overlap with an adjacent part of the conductors layer; when the conductive layer is floating, such overlap causes a voltage change on the conductive layer due to a capacitive coupling. This can aid injection of charge carriers of the said opposite conductivity type, for example it can aid hot hole injection from the said second semiconductor device structure into the insulating layer portion, as is described hereinafter.

The conductive layer may have a portion which is an insulated gate of a field effect transistor which provides a read-out for the memory store. In this case, when the second semiconductor device structure is a field effect transistor as described in the preceding two paragraphs, the hot hole injection is effected by this transistor structure, having p-type source, drain and channel regions, while the hot electron injection may be effected by avalanche breakdown of either the source junction of the read-out field effect transistor.

The said first and second semiconductor device structures may have a common semiconductor region, and may form together a composite structure.

In one form, the conductive layer is a metal layer. In another form, at least part of the said conductive layer is a high conductivity silicon layer situated on the insulating layer portion and covered by a further portion of the insulating layer. It will be evident that the said conductive layer may consist of distinct layer parts (for example high conductivity silicon layer parts) which are associated with the first and second device structures and which are electrically connected together (for example by a metal interconnection). Furthermore, various parts of the said insulating layer portion may be of different materials; in particular, the material of the one part of the insulating layer portion, adjacent the said first semiconductor device may be chosen to be different from that of the other part, adjacent the said second semiconductor device, so that the barrier presented by the one part is less for electron injection than for holes while that presented by the said other part permits hole injection.

It will be obvious that the element can be integrated with suitable addressing elements to form a memory "bit", and that an array of such bits can be integrated, for example on a common semiconductor substrate, together with decode and address circuitry of the memory store.

An embodiment of the invention will now be described, by way of example, with reference to the accompanying diagrammatic drawings, in which.

Figure 1:
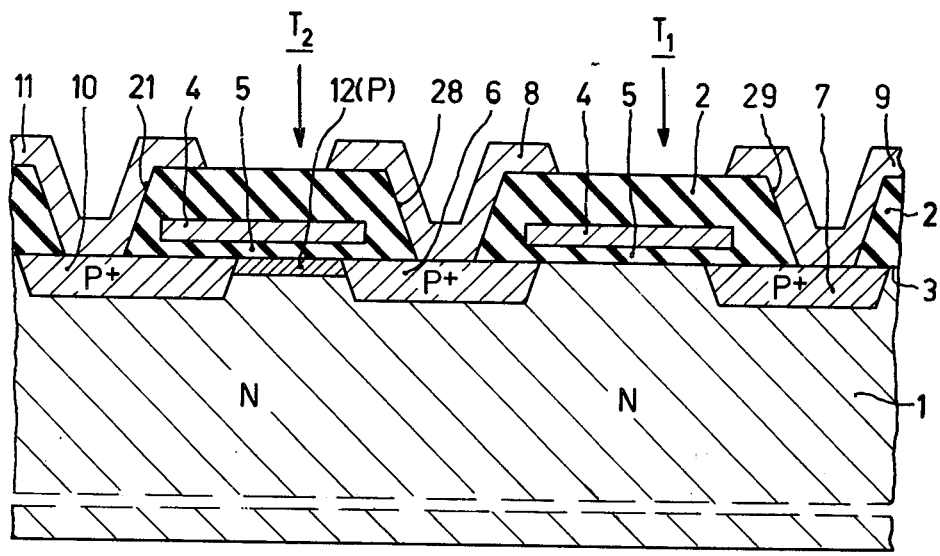
FIG. 1 is a cross-sectional view of a non-volatile memory element of a read-write integrated semiconductor memory.
Figure 2:
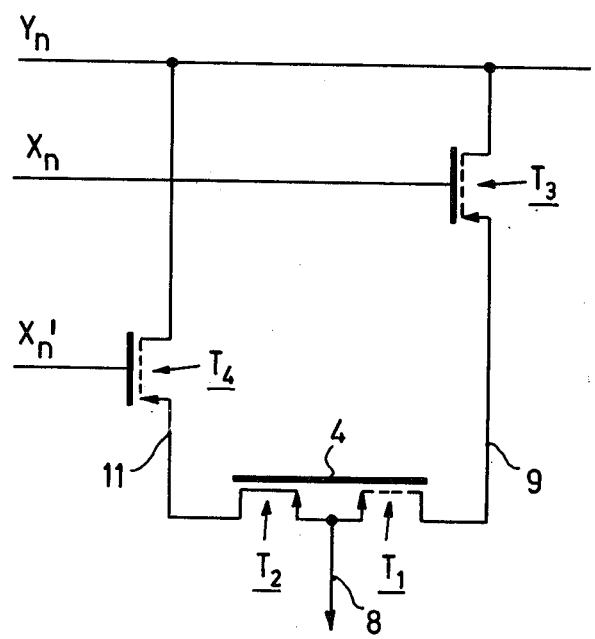
FIG. 2 is a circuit diagram of part of the integrated semiconductor memory including the element of FIG. 1.
Figure 3:
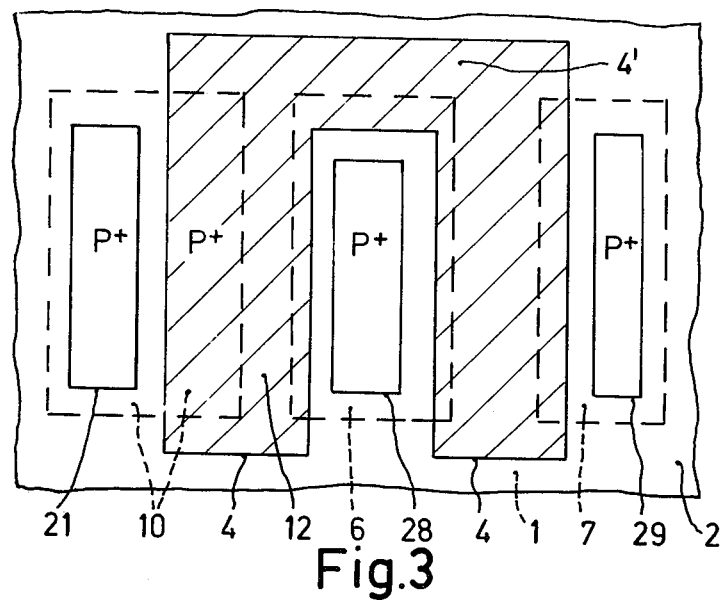
FIG. 3 is a plan view of the memory element of FIG. 1 with source and drain contacts omitted for the sake of clarity.

The memory of FIGS. 1, 2 and 3 comprises a silicon body or substrate 1 having an insulating layer 2 at a surface 3 thereof. A partially annular conductive layer 4 of high conductivity silicon is present on a portion 5 of the layer 2 and is covered by a further portion of the layer 2; thus, the conductive silicon layer 4 is completely surrounded by insulating material, no discharge path is available for charge stored on the silicon layer 4, and a comparatively stable non-volatile memory element results. The silicon layer 4 is shown in solid outline and with cross-hatching in FIG. 3.

The conductive silicon layer 4 forms a floating, common gate electrode of insulated gate field effect transistor structures $T_1$ and $T_2$ of the memory store. The transistor structures $T_1$ and $T_2$ are present in an p-type portion of the silicon substrate 1 adjacent different parts of the layer portion 5. As described hereinafter, the transistor structures $T_1$ and $T_2$ provide means for injecting hot electrons and hot holes respectively from the silicon substrate 1 into the layer portion 5 to write negative and positive charges respectively on the conductive silicon layer 4 and determine different memory states. The transistor structure $T_1$ also permits reading of the change state of the conductive silicon layer 4 and thus of the state of the memory.

The transistor structure $T_1$ is a p-type channel enhancement insulated gate field effect transistor comprising high conductivity p-type source and drain regions 6 and 7 separated by an n-type substrate portion. The source and drain regions 6 and 7 are contacted, at windows 28 and 29 respectively in the insulating layer 2, by electrodes 8 and 9 respectively. A negative charge on the silicon layer 4 induces a p-type inversion channel in the n-type substrate portion between the source and drain regions 6 and 7; this determines an ON state (conduction) in the transistor $T_1$. However, if there is a positive or substantially no charge on the silicon layer 4, no such a p-type channel is induced so that the transistor $T_1$ is in an OFF state (non-conductive), unless such a high voltage pulse is applied between source and drain electrodes 8 and 9 that avalanche breakdown of either the source of drain region junctions occurs.

The transistor structure $T_2$ is a p-type channel depletion insulated gate field effect transistor comprising high conductivity p-type source and drain regions 6 and 10 contacted at windows 21 and 28 by electrodes 8 and 11, and having between these regions 6 and 10 an implanted p-type channel region 12. It is to be noted that the region 6 and electrode 8 provide the source region and source electrode for both transistor $T_1$ and transistor $T_2$. The implanted p-type channel region 12 determines an ON state (conductive) in the transistor $T_2$, unless a high positive charge is present on the silicon layer 4. The drain region 10 has a considerable overlap with the adjacent part of the silicon layer 4. The purpose of this overlap will become evident hereinafter.

As shown in FIG. 2, the drain electrode 9 of transistor $T_1$ is connected to the source of a p-type enhancement insulated gate field effect transistor structure $T_3$ also present in the silicon substrate 1. The drain of transistor $T_3$ is connected to a Y select line $Y_n$, while the insulated gate of the transistor $T_3$ is connected to an X select line $X_n$. The drain electrode 11 of the transistor $T_2$ is connected to the source of another p-type enhancement insulated gate field effect transistor structure $T_4$ also present in the silicon substrate 1. The drain of transistor $T_4$ is connected to the same Y select line $Y_n$ while the insulated gate of the transistor $T_4$ is connected to another X select line $X_n'$. Transistor $T_1$ has a lower avalanche break-down voltage then transistors $T_3$ and $T_4$. This lower break-down voltage may be achieved by implanting extra donor impurity in the channel between source and drain regions 6 and 7 of transistor $T_1$, or by arranging for the junctions with the source and drain regions 6 and 7 to have a higher curvature than the corresponding junctions in transistors $T_3$ and $T_4$.

The arrangement shown in FIG. 2 performs in the following manner.

In the WRITE "0" mode, a negative voltage pulse is applied to the line $X_n$ and a larger negative voltage pulse is applied to the line $Y_n$. The negative pulse on the insulated gate of transistor $T_3$ induces a p-type inversion channel to connect the source and drain of transistor $T_3$ and transmit the large negative pulse on line $Y_N$ to the drain electrode 9 of transistor $T_1$. The pulse so applied to the drain electrode 9 is chosen high enough to produce avalanche breakdown of the junction between the p-type substrate portion and either the source region 6 or the drain region 7. Such a pulse may be, for example, -30 volts. Such avalanche breakdown produces hot electron-hole pairs. The injection barrier for electrons from the silicon substrate 1 into the part of layer portion 5 adjacent $T_1$ is less than the corresponding barrier for holes; this can be achieved by having at least this part as silicon oxide thermally grown in dry oxygen. Thus, the avalanche breakdown in this device results in the injection of hot electrons into the layer portion 5 in preference to the hot holes also produced. Such avalanche injection of hot electrons results in the transfer of negative charge to the silicon layer 4. It is to be noted that the avalanche injection of hot electrons employs the pn-junction of either the source or drain region as an avalanche diode which both produces and heats an electron current. A negative charge state on the silicon layer 4 denotes an "0" memory state. If a negative charge state were present already on the silicon layer 4, then transistor $T_1$ would conduct without avalanche breakdown, but the required 0 memory state would be already written.

In the WRITE "1" mode, a negative voltage pulse is applied to both the line $X_n'$ and to the line $Y_n$. The magnitude of the pulse applied to the line $Y_n$ is less than that which produces avalanche breakdown in transistors $T_1$ and $T_3$. The negative pulse on the insulated gate of transistor $T_4$ induces a p-type inversion channel to connect the source and drain of transistor $T_4$ and transmit the negative pulse on line $Y_n$ to the drain electrode 11 of transistor $T_2$. The pulse applied to the drain electrode 11 produces a high electric field between the source and drain regions 6 and 10. The magnitude of this pulse and the spacing of the source and drain regions 6 and 10 are chosen such that the resulting field is of the order $10^5$ volts/c.m. The spacing of the source and drain regions is less than 2 microns, and preferably is of sub-micron dimensions. Provided there is no high positive charge state on the silicon layer 4, conduction occurs in the transistor $T_2$. A hole current is produced by the source region 6. The high electric field between the source and drain regions 6 and 10 is substantially parallel to the surface 3 and to the hole drift in the channel 12. Thus, the temperature of holes flowing in the high electric field can be raised to several times the lattice temperature so that hot holes are produced and injected across the barrier into the layer portion 5. The injection of these hot holes transfers positive charge to the silicon layer 4 to write a 1 memory state. If a high positive charge were present already on the silicon layer 4, then transistor $T_2$ may not conduct, but the required 1 memory state would be already written. The considerable overlap between the drain region 10 and the adjacent part of the silicon layer 4 aids the injection of hot holes; thus, there is a capacitive coupling between the drain electrode 11 and the silicon layer 4 at the overlap, so that the silicon layer 4 tends to assume a more negative potential as a result of the negative pulse transmitted to drain electrode 11; this tendency of the silicon layer 4 to float more negatively produces across the part of the insulating layer portion 5 adjacent transistor $T_2$ a field which attracts holes and thus aids the hot hole injection.

In the READ mode, a negative voltage pulse is applied to both the line $X_n$ and the line $Y_n$. The magnitude of the pulse applied to the line $Y_n$ is less than that needed to produce avalanche breakdown in the transistor $T_1$. As in the WRITE 0 mode, the negative pulse on line $Y_n$ is transmitted to drain electrode 9 of transistor $T_1$. If the memory state is 1, then, as mentioned hereinbefore, the presence of positive or substantially no negative charge on the silicon layer 4 determines an OFF state for the transistor $T_1$; this OFF state will block the applied pulse so that an unchanged 1 state is read at source electrode 8. However, if the memory state is 0, then, as mentioned hereinbefore, the presence of the negative charge state on the silicon layer 4 determines an ON state for the transistor $T_1$; this ON state transmits the applied pulse to the source electrode 8 so that a changed 0 state is read.

The source and drain regions (for example regions 6, 7 and 10) of transistors $T_1$, $T_2$, $T_3$ and $T_4$ are formed by acceptor diffusion or implantation into the surface 3 of the n-type silicon substrate portion. The insulating layer portion 5 may comprise silicon oxide and may have a thickness of approximately 1,000 A. The silicon layer 4 is formed by deposition on the layer portion 5. The silicon layer 4 is covered by a further portion of the insulating layer 2, which further portion may be of vapour deposited silicon oxide and may have a thickness of approximately 1 micron. The p-type channel of transistor $T_2$ is formed by acceptor ion implantation.

It will be evident that the conductive layer 4 need not be continuous but may consist of two distinct layer parts (for example of silicon) which are associated with the two transistors $T_1$ and $T_2$ respectively and which are interconnected electrically (for example by a metal layer interconnected). The insulating layer portion 5 may consist of distinct parts of different materials; thus, for example, the part adjacent the transistor $T_1$ may be of thermally grown silicon oxide, while the part adjacent the transistor $T_2$ is of a different material which presents less of a barrier for hot hole injection; silicon nitride or silicon nitride on thin silicon oxide may be advantageous for hole injection, and thermally-assisted tunnelling may be employed.

The drain electrode 10 of transistor $T_2$ is shown in FIGS. 1 and 3 as overlapping the silicon layer 4 adjacent the channel 12. Such an overlap affects the distance between source and drain regions 6 and 10 and thus affects the length of the short channel 12. To facilitate precise control of the length of this short channel 12, it may be preferable to provide the considerable overlap between drain region 10 and silicon layer 4 in another area of the device, more remote from the channel 12.

Figure 4:
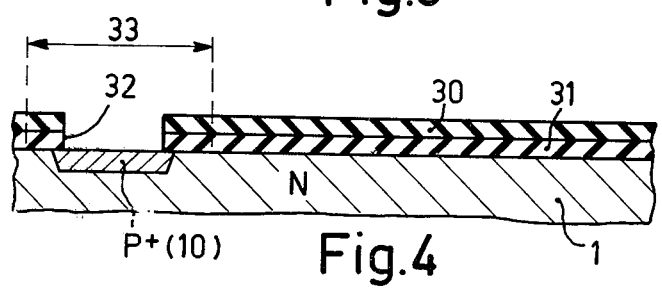
FIGS. 4 to 6 are cross-sectional views of a semiconductor body part at stages in the manufacture of a memory element similar to that of FIGS. 1 to 3.
Figure 5:
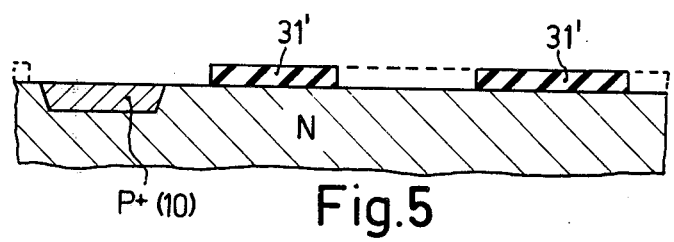
Figure 6:
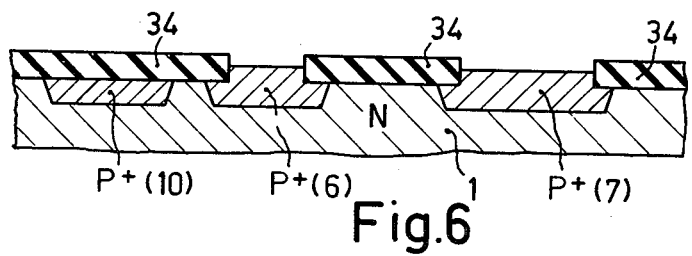

FIGS. 4 to 6 illustrate one method of manufacturing such a memory element to obtain a submicron spacing between source region 6 and drain region 10 of transistor $T_2$.

On a surface of an n-type substrate portion 1 there is provided by conventional techniques a silicon oxide layer 30 on a silicon nitride layer 31. An aperture 32 is provided in both layers 30 and 31 to expose the silicon surface for an impurity diffusion where the drain region 10 is to be formed. An acceptor impurity such as boron is diffused into the substrate surface to form the highly doped p-type region 10. The resulting structure is shown in FIG. 4.

Next, an etchant is used which etches silicon nitride but does not attack silicon oxide. In this way, the nitride layer 31 where exposed at the window 32 in the silica layer 30 is attacked and underetched until an opening of width 33 is formed in the nitride layer 31. It is the right-hand edge of this opening 33 as shown in FIG. 4 which determines the spacing between the source region 6 to be formed and the drain region 10.

After forming the window 33 the nitride layer 31 is removed (by etching), except where the source and drain regions 6 and 7 are to be formed. The removed portions of layer 31 are shown in broken outline in FIG. 5, and the remaining parts are designated by reference numeral 31'. It should be noted that the nitride layer part which was adjacent the right-hand edge of opening 33 has not been removed. If the source and drain regions of other transistors for example $T_3$ and $T_4$ are to be formed simultaneous with those of $T_1$, then nitride layer parts 31' will also be retained where their source and drain regions are to be formed.

Next, the substrate 1 is subjected to an oxidation treatment to grow a silicon oxide layer 34 adjacent the substrate surface except where masked by the nitride layer parts 31'. Then, the nitride layer parts 31' are removed by a selective etchant; the resulting structure adjacent the substrate surface is an oxide layer 34 having windows therein where source and drain regions are to be formed in the substrate 1.

The substrate 1 is then subjected to an acceptor impurity diffusion, for example of boron, so forming highly doped p-type regions 6 and 7. It will be obvious that during this diffusion and the preceding oxidation, the previously provided acceptor impurities in region 10 will diffuse further in the substrate 1. However the extent of this further diffusion of region 10 is predictable; therefore allowance can be made for his further diffusion of region 10 and the lateral diffusion of region 6, when calculating the required extent of underetching of nitride layer 31 to give the desired spacing between regions 6 and 10.

Subsequently, the oxide layer 34 can be removed from the channel regions of the transistors between the source and drain regions, and the thin insulating layer portions and gate electrodes can then be provided. Thus for instance the floating gate layer 4 is deposited on the underlying insulating layer portions 5 and then subsequently covered with further insulating material to bury the layer 4. It will be evident that the part 4' (see FIG. 3) of the layer 4 which connects the parts forming the floating gates of transistors $T_1$ and $T_2$ can be provided on a thicker insulating layer portion than layer portions 5 over the channel regions of these transistors. Thus part 4' may be provided on a thick oxide layer part 34, see FIG. 6, and may be, for example, a metal layer connection betrween two conductive silicon gate layers 4.

The p-type channel 12 of transistor $T_2$ may be provided by boron implantation. The boron ion dose may be for example $5 \times 10^{12}$ ions/cm$^2$, and may be implanted through the thin insulating layer portion 5 of transistor $T_2$.

The increased overlap of the floating gate provides one capacitive coupling means of attracting and thus aiding hot carrier injection. Other capacitive coupling means for attracting and aiding hot carrier injection are possible; thus, for example, a further, non-floating gate may be provided on the insulating layer over the floating gate, and, when appropriate potentials are applied to this further gate, hot holes or hot electrons may be attracted towards the floating gate.

What is claimed is:
1. A semiconductor memory element comprising:
   a. a semiconductor substrate comprising a first surface;
   b. an insulating layer comprising an insulating portion adjacent said first surface;
   c. a charge storage element comprising a conductive layer disposed on said insulating layer portion and separated thereby from said semiconductor substrate;
   d. means for injecting hot electrons from said semiconductor substrate into said insulating layer portion to write a first charge state on said conductive layer, said electron injecting means comprising a first semiconductor device element located in said semiconductor substrate adjacent one part of said insulating layer portion; and
   e. means for injecting hot holes from said semiconductor substrate into said insulating layer portion to write a second charge state on said conductive layer, said hole injecting means comprising a second semiconductor device element present in said semiconductor substrate adjacent another part of said insulating layer portion.

2. A memory element as claimed in claim 1, wherein at least one of said first and second semiconductor device elements is a transistor structure adapted to produce in said semiconductor substrate a current of a first type charge carriers and to produce in said semiconductor substrate adjacent said insulating layer portion an electric field for increasing the energy of said first type charge carriers, so that hot charge carriers of said first type are injected into said insulating layer portion from said semiconductor substrate.

3. A memory element as claimed in claim 2, wherein said semiconductor substrate comprises at least a first conductivity type portion having said transistor structure that is of the field effect variety and is disposed at said first structure, said field effect transistor structure comprising source, drain, and channel portions, said channel portion comprising a shallow surface layer of an opposite second conductivity type in said substrate portion.

4. A memory element as claimed in claim 3, wherein said source and drain portions comprise source and drain regions of said opposite second conductivity type present in said substrate portion and respective source and drain electrodes contacting said regions.

5. A memory element as claimed in claim 3, wherein said shallow surface layer comprises a semiconductor region that is of said opposite second conductivity type and comprises an implanted doping impurity.

6. A memory element as claimed in Claim 3, wherein a part of said drain electrode overlaps a part of said conductive layer, thereby aiding said injection of said charge carriers of said opposite second conductivity type.

7. A memory element as claimed in claim 3, further comprising a read-out field effect transistor and wherein a portion of said conductive layer comprises an insulating gate of said read-out field effect transistor, said read-out field effect transistor providing a read-out for the memory store.

8. A memory element as claimed in claim 7, wherein at least one of said source and drain junctions of said read-out field effect transistor is adapted to be operated in an avalanche breakdown mode so as to effect hot electron injection and wherein said transistor structure has a p-type channel region and effects hot hole injection.

9. A memory element as claimed in claim 1, wherein said first and second semiconductor device structures have a common semiconductor region.

10. A memory element as claimed in claim 1, wherein at least part of said conductive layer is a high conductivity silicon layer said silicon layer portion being situated on said insulating layer portion and covered by a further portion of said insulating layer.

* * * * *